United States Patent
Tsorng et al.

(10) Patent No.: US 12,235,693 B2
(45) Date of Patent: Feb. 25, 2025

(54) TRANSVERSE DRIVE TRAY ASSEMBLY

(71) Applicant: Quanta Computer Inc., Taoyuan (TW)

(72) Inventors: Yaw-Tzorng Tsorng, Taoyuan (TW); Tung-Hsien Wu, Taoyuan (TW); Shin-Ming Su, Taoyuan (TW); Po-Yu Han, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 148 days.

(21) Appl. No.: 18/117,020

(22) Filed: Mar. 3, 2023

(65) Prior Publication Data

US 2024/0295908 A1  Sep. 5, 2024

(51) Int. Cl.
*G06F 1/18* (2006.01)
*G11B 33/12* (2006.01)
*H05K 7/14* (2006.01)

(52) U.S. Cl.
CPC ............ *G06F 1/187* (2013.01); *G11B 33/128* (2013.01); *H05K 7/1409* (2013.01); *H05K 7/1489* (2013.01)

(58) Field of Classification Search
CPC ........ G06F 1/1658; G06F 1/184; G06F 1/187; H05K 7/1401; H05K 7/1402; H05K 7/1409; H05K 7/1411; H05K 7/1415; H05K 7/1417; H05K 7/1418; H05K 7/1422; H05K 7/1424; H05K 7/1427; H05K 7/1428; H05K 7/1429; H05K 7/1461; H05K 7/1487; H05K 7/1488; H05K 7/1489; H05K 7/16; G11B 33/022; G11B 33/08; G11B 33/12; G11B 33/128

USPC ..................................................... 361/679.33
See application file for complete search history.

(56) References Cited

U.S. PATENT DOCUMENTS

| | | | | |
|---|---|---|---|---|
| 5,481,431 | A | * | 1/1996 | Siahpolo ................ G11B 33/08 |
| 5,641,296 | A | * | 6/1997 | Larabell ........... H01R 13/62933 |
| 5,967,824 | A | * | 10/1999 | Neal ....................... G06F 1/186 439/157 |
| 6,115,258 | A | * | 9/2000 | Hoyle, Jr. ............. H05K 7/1409 361/752 |
| 6,411,517 | B1 | * | 6/2002 | Babin .................. H05K 7/1461 361/759 |
| 7,126,817 | B2 | * | 10/2006 | Li ........................... G06F 1/184 |

(Continued)

FOREIGN PATENT DOCUMENTS

CN  203025621 U  *  6/2013

*Primary Examiner* — Adrian S Wilson
*Assistant Examiner* — Gage Crum
(74) *Attorney, Agent, or Firm* — NIXON PEABODY LLP

(57) ABSTRACT

A drive tray assembly is disclosed for placing drives (e.g., hard disk drives) in a computer chassis in a rotated orientation and without the need for additional tools. A tray base holding a drive can be slid into a receiving space of the chassis in a longitudinal direction. An installation lever rotatably attached to the tray base includes a shaft that engages a corresponding receiving slot of the receiving space. After the tray base is inserted, rotation of the installation lever to a closed position causes the tray base, and thus the drive, to move in a direction perpendicular to the longitudinal direction. A release lever rotatably attached to the tray base can secure the installation lever in the closed position until the release lever is rotated, freeing the installation lever to move to the open position in which the drive tray may be removed from the chassis.

20 Claims, 12 Drawing Sheets

(56) References Cited

U.S. PATENT DOCUMENTS

| | | | | |
|---|---|---|---|---|
| 7,742,292 B1* | 6/2010 | Chong, Jr. | ........... | H05K 7/1489 |
| | | | | 361/679.33 |
| 8,369,079 B2* | 2/2013 | Collins | ................ | G11B 33/128 |
| | | | | 369/75.21 |
| 8,582,287 B2* | 11/2013 | Nguyen | ................ | G11B 33/124 |
| | | | | 211/126.6 |
| 8,665,608 B2* | 3/2014 | Hayashi | ................ | H05K 7/1409 |
| | | | | 361/728 |
| 9,426,920 B2* | 8/2016 | Terwilliger | ........... | H05K 7/1401 |
| 9,629,275 B1* | 4/2017 | Beall | .................... | G11B 33/128 |
| 9,727,099 B1* | 8/2017 | Hastings | ................. | G06F 1/187 |
| 9,947,371 B1* | 4/2018 | Hu | ....................... | G11B 33/005 |
| 10,061,362 B2* | 8/2018 | Jau | ....................... | H05K 7/1487 |
| 10,462,925 B1* | 10/2019 | Beall | .................... | H05K 7/1401 |
| 11,171,450 B2* | 11/2021 | Sassano | ........... | H01R 13/62977 |
| 11,539,164 B2* | 12/2022 | Huang | ................ | H05K 7/1409 |
| 2005/0047075 A1* | 3/2005 | Roesner | ................ | G06F 1/187 |
| 2014/0353264 A1* | 12/2014 | Venugopal | ........... | H05K 7/1487 |
| | | | | 211/41.17 |
| 2024/0314966 A1* | 9/2024 | Chuang | ................ | H05K 7/1489 |

* cited by examiner

TRANSVERSE DRIVE TRAY ASSEMBLY

TECHNICAL FIELD

The present disclosure relates to computer chassis generally and more specifically to trays for securing drives within chassis.

BACKGROUND

Computer chassis are used in many forms and in many environments, and often include hard disk drives (HDDs) designed to be removably inserted into the chassis. In the example of a common server chassis, an HDD can be installed into a removable HDD tray, which can in turn be inserted from the front side to the rear side of the server chassis. Installation in this direction causes connectors at the end of the HDD to interact with receiving connectors on a HDD backplane located even further towards the rear of the server chassis. In such installations, the "long" dimension of the HDD tray is aligned parallel to the y-axis (e.g., front-to-back axis) of the server chassis. Thus, while such orientations can maximize the number of HDDs that could be installed through the front of the server chassis, it results in the HDD trays and the HDD backplane occupying significant amounts of y-axis space. Since server chassis must be designed to fit within a limited amount of space (e.g., within a server rack), the amount of space left for other components within the server chassis and/or behind the server chassis is limited. For example, the size of motherboard able to be used in the server chassis may be limited, and the amount of rear cable management space available is limited.

There is a need for improved chassis capable of receiving drives in improved manners. Certain aspects of the present disclosure address this need and other needs.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, supplemented by this summary. This summary is a high-level overview of various aspects of the disclosure and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings and each claim.

Embodiments of the present disclosure include a drive tray assembly comprising a tray base. The tray base is slidably insertable into a receiving space of a chassis in a longitudinal direction. The tray base has a top surface for receiving a drive oriented in a transverse direction such that a connector of the drive rests in a connector plane that is parallel to the longitudinal direction. The drive tray assembly further comprises an installation lever. The installation lever is rotatably coupled to a bottom surface of the tray base at a pivot. The pivot defines a pivot plane parallel to the connector plane. The installation lever is rotatable between a closed position and an open position. The installation lever has a shaft extending from a lever bottom surface at a position spaced apart from the pivot. The shaft defines a shaft plane parallel to the pivot plane. Rotation of the installation lever from the open position to the closed position causes a distance between the pivot plane and the shaft plane to increase. The shaft is insertable into a receiving slot of the receiving space such that rotation of the installation lever from the open position to the closed position causes the connector plane to move away from the shaft plane.

Embodiments of the present disclosure include a method, comprising providing a computer chassis having a receiving space and a computing device. The method further comprises providing a drive tray assembly. The drive tray assembly includes a tray base slidably insertable into the receiving space of the computer chassis in a longitudinal direction. The tray base has a top surface for receiving a drive oriented in a transverse direction such that a connector of the drive rests in a connector plane that is parallel to the longitudinal direction. The drive tray assembly further includes an installation lever. The installation lever is rotatably coupled to a bottom surface of the tray base at a pivot. The pivot defines a pivot plane parallel to the connector plane. The installation lever is rotatable between a closed position and an open position. The installation lever has a shaft extending from a lever bottom surface at a position spaced apart from the pivot. The shaft defines a shaft plane parallel to the pivot plane. The method further comprises placing the drive on the top surface of the tray base. The method further comprises sliding the tray base into the receiving space of the computer chassis. Sliding of the tray base into the receiving space causes the shaft to be received by a receiving slot of the receiving space. The method further comprises rotating the installation lever from the open position to the closed position. Rotation of the installation lever from the open position to the closed position causes a distance between the pivot plane and the shaft plane to increase. The receiving slot constrains the shaft such that rotation of the installation lever from the open position to the closed position causes the connector of the drive to mate with a corresponding connector of the computing device.

BRIEF DESCRIPTION OF THE DRAWINGS

The specification makes reference to the following appended figures, in which use of like reference numerals in different figures is intended to illustrate like or analogous components.

DETAILED DESCRIPTION

Figure 1:
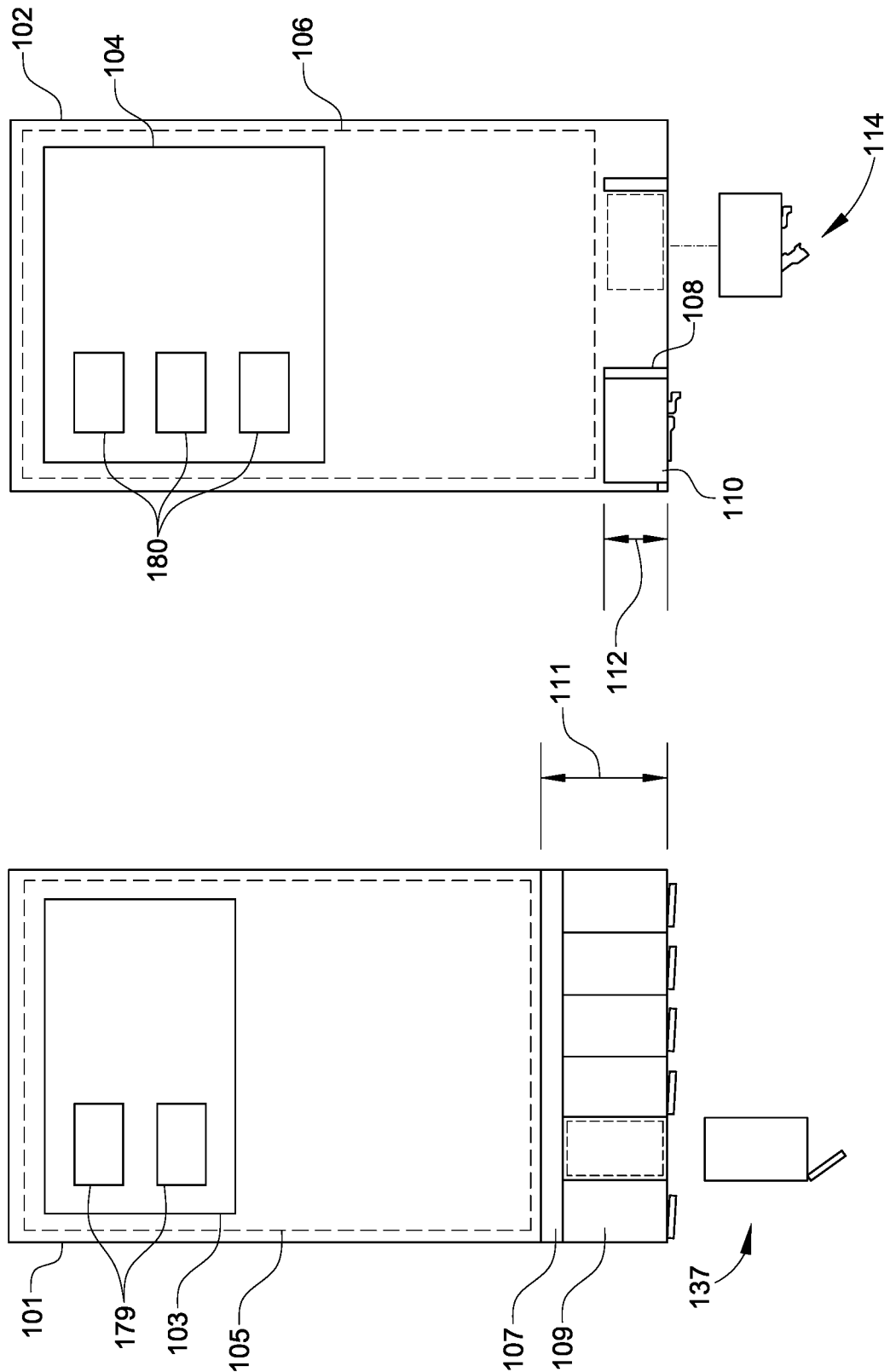
FIG. 1 is a schematic comparison top view of a standard computer chassis and a computer chassis with a transverse drive tray assembly, according to certain aspects of the present disclosure.

Certain aspects and features of the present disclosure relate to a drive tray assembly for placing drives (e.g., hard disk drives) in a computer chassis in a rotated (e.g., transverse) orientation and without the need for additional tools. The drive tray assembly includes a tray base designed to be slid into a receiving space of the chassis in a longitudinal direction. An installation lever rotatably attached to the tray base includes a shaft that engages a corresponding receiving slot of the receiving space, such that rotation of the installation lever to a closed position after the tray base is inserted into the receiving slot causes the tray base, and thus the drive therein, to move in a direction perpendicular to the longitudinal direction. A release lever can be rotatably attached to the tray base to secure the installation lever in the closed position until the release lever is rotated, thus freeing the installation lever to move to the open position in which the drive tray may be removed from the chassis.

Standard chassis (e.g., server chassis) into which drives (e.g., hard disk drives) are placed generally accept drives at a front end of the chassis. Making drives accessible through the front end of the chassis facilitates easy and quick drive installation and removal. Many standard chassis make use of drive trays to which a drive is attached, such as via screws. The drive tray can then be pushed into the front end of the chassis until the drive's connector couples with a corresponding connector of a drive backplane located further within the chassis. When it comes time to remove a drive, a user typically pulls on a lever of the drive tray to creating a pulling force that pulls the drive away from the drive backplane and out of the chassis. The total amount of longitudinal space (e.g., space from the front end of the chassis to the rear end of the chassis) occupied by the drives, drive trays, drive backplane, and associated hardware is often significant, such as at or around 145.85 mm. As a result, the remaining space available in the chassis is limited.

Certain aspects and features of the present disclosure include a drive tray assembly that permits drives to be placed in a rotated (e.g., transverse) orientation within a chassis, while still maintaining easy access from an end of the chassis to enable quick and easy drive installation and removal. The drive tray assembly includes a tray base with a front-facing installation lever. A drive can be placed in the drive tray assembly, which can then be inserted into a drive frame of the chassis such that the drive tray assembly is inserted in a longitudinal direction (e.g., from a front or rear end of the chassis to an opposite end) while the drive itself is oriented in a transverse direction (e.g., for a hard disk drive, oriented such that the long side is perpendicular to the longitudinal direction). A shaft on the installation lever can be received by a receiving slot in an alignment plate of the drive frame as the drive tray assembly is inserted into the drive frame. After the drive tray assembly is inserted, pressing the installation lever can cause the drive to move in the transverse direction, thus causing the drive's connector to engage a corresponding connector of the computer system.

A single drive backplane can have corresponding connectors for one or more drive tray assemblies. When multiple drive tray assemblies are used, they may be stacked or placed side-by-side in any suitable number. Because the drives are oriented 90° rotated with respect to drives in a standard chassis, less longitudinal space within the chassis is occupied by the drives, drive trays, drive backplane(s), and associated hardware. According to certain aspects of the present disclosure, the amount of longitudinal space occupied by the drive tray assembly and its drive frame is at or around 76.9 mm, which is a 47% reduction from the amount of longitudinal space occupied in standard drives. This newly available space can be used for additional computing components (e.g., additional processors on a larger motherboard), for improved cooling (e.g., more room to direct airflow to needed locations and/or more room for additional cooling equipment), for improved cable management, or for other uses.

Additionally, certain aspects and features of the present disclosure include a drive tray assembly that permits drive installation and removal without the need for tools. In standard chassis, drives must generally be attached to drive trays with screws or other fasteners to avoid vertical or horizontal movement once installed. Certain aspects and features of the present disclosure include a slidable wall with retention pegs within the chassis. The slidable wall is slidably coupled to the tray base of the drive tray assembly such that it can move towards and away from a drive placed in the tray base. To secure the drive, the slidable wall is moved towards the drive until the retention pegs interact with the side mounting holes of the drive. Corresponding retention pegs on the opposite side of the tray base can interact with corresponding side mounting holes on that opposite side of the drive. A detent mechanism (e.g., a ball and detent mechanism) can be used to temporarily secure the slidable wall in the contracted state. When it is desired to remove the drive, manual (e.g., by hand) force applied to the slidable wall can overcome the detent mechanism, permitting the slidable wall to slide outwards, to an expanded state, in which the side mounting holes of the drive no longer receive the retention pegs, thus permitting the drive to me easily removed.

Certain aspects and features of the present disclosure provide for a drive tray assembly that permits easy and quick access to install and/or remove drives (e.g., hard disk drives) without the need for tools.

These illustrative examples are given to introduce the reader to the general subject matter discussed here and are not intended to limit the scope of the disclosed concepts. The following sections describe various additional features and examples with reference to the drawings in which like numerals indicate like elements, and directional descriptions are used to describe the illustrative embodiments but, like the illustrative embodiments, should not be used to limit the present disclosure. The elements included in the illustrations herein may not be drawn to scale.

FIG. 1 is a schematic comparison top view of a standard computer chassis 101 and a computer chassis 102 with a transverse drive tray assembly 114, according to certain aspects of the present disclosure. For illustrative purposes, various structures and computer components, including wiring, are not shown.

The standard computer chassis 101 includes a series of drives 109 installed (e.g., with screws) within removable drive trays 137. For illustrative purposes, the second drive tray 137 from the left is shown in a removed state. The drives 109, when installed in the standard computer chassis 101, are longitudinally aligned (e.g., the long axis of the drive being aligned) with the longitudinal axis of the standard computer chassis 101 (e.g., the y-axis of the standard computer chassis 101, or bottom-to-top axis as seen in FIG. 1). Each drive 109 is coupled to a common drive backplane 107. The drives 109 and drive backplane 107 occupy a certain amount of longitudinal space, referred to as the drive space 111. The remainder of the standard computer chassis 101 not occupied by the drive space 111 is referred to as the non-drive space 105. The non-drive space 105 can include various components and structures, including a motherboard 103 containing a limited number of processors 179 (e.g., two processors 179, as seen in FIG. 1).

A computer chassis 102 according to certain aspects of the present disclosure is depicted in comparison with the standard computer chassis 101. The computer chassis 102 includes multiple drives 110 installed (e.g., without the use of tools) in drive tray assemblies 114 that hold a drive 110 in a transverse orientation (e.g., perpendicular to the longitudinal axis of the computer chassis 102). The drive tray assemblies 114 can be inserted into the computer chassis 102 in a direction parallel to the longitudinal axis of the computer chassis 102 during installation. For illustrative purposes, the drive tray assembly 114 on the right is shown removed from the computer chassis 102. When the drives 110 are fully installed (e.g., the drives 110 are installed in their respective drive tray assemblies 114, each of which is installed in the computer chassis such that each drive 110 is communicatively coupled its respective drive backplane 108), they are longitudinally aligned (e.g., the long axis of the drive being aligned) perpendicular to the longitudinal axis of the computer chassis 102. More specifically, the drives 110 can be longitudinally aligned along an axis that is perpendicular to the sidewalls of the computer chassis 102. In some cases, this alignment can be referred to as a transverse orientation (e.g., the long-axis of the drive is perpendicular to the longitudinal axis of the computer chassis 102). The drives 110 and drive backplanes 108 occupy a certain amount of longitudinal space, referred to as the drive space 112. The remainder of the computer chassis 102 not occupied by the drive space 112 is referred to as the non-drive space 106. The non-drive space 106 can include various components and structures, including a motherboard 104 containing a number of processors 180 (e.g., three processors 180, as seen in FIG. 1).

As seen in the comparison of the standard computer chassis 101 with standard drives 109 and the computer chassis 102 according to certain aspects of the present disclosure, the computer chassis 102 has greater non-drive space 106 than the non-drive space 105 of the standard computer chassis 101. This greater non-drive space 106 can be utilized in various fashions to improve the computing ability, cooling ability, weight, storage ability, cost, organization, or other aspects of the computing system associated with the computer chassis 102. For example, as depicted in FIG. 1, a larger motherboard 104 (e.g., larger than the motherboard 103) is able to be used in the computer chassis 102, which can permit the use of a greater number of processors 180 than available for the motherboard 103. This greater number of processors 180 can be leveraged to improve the computing ability and/or efficiency of the computing system associated with computer chassis 102 over that of the computing system associated with the standard computing chassis 101.

Computer chassis 102 can include any number of drives 110, depending on the height and width of the computer chassis 102. In some cases, the computer chassis 102 has a width suitable for receiving two drive tray assemblies 114, with the total number of drives 110 defined by the height of computer chassis 102 (e.g., a computer chassis 102 of a first height that is two drives high, permitting four total drives 110, whereas a computer chassis 102 of a second height that is three drives high would permit six total drives 110). Any suitable number of drives 110 and/or drive tray assemblies 114 may be used.

Figure 2:
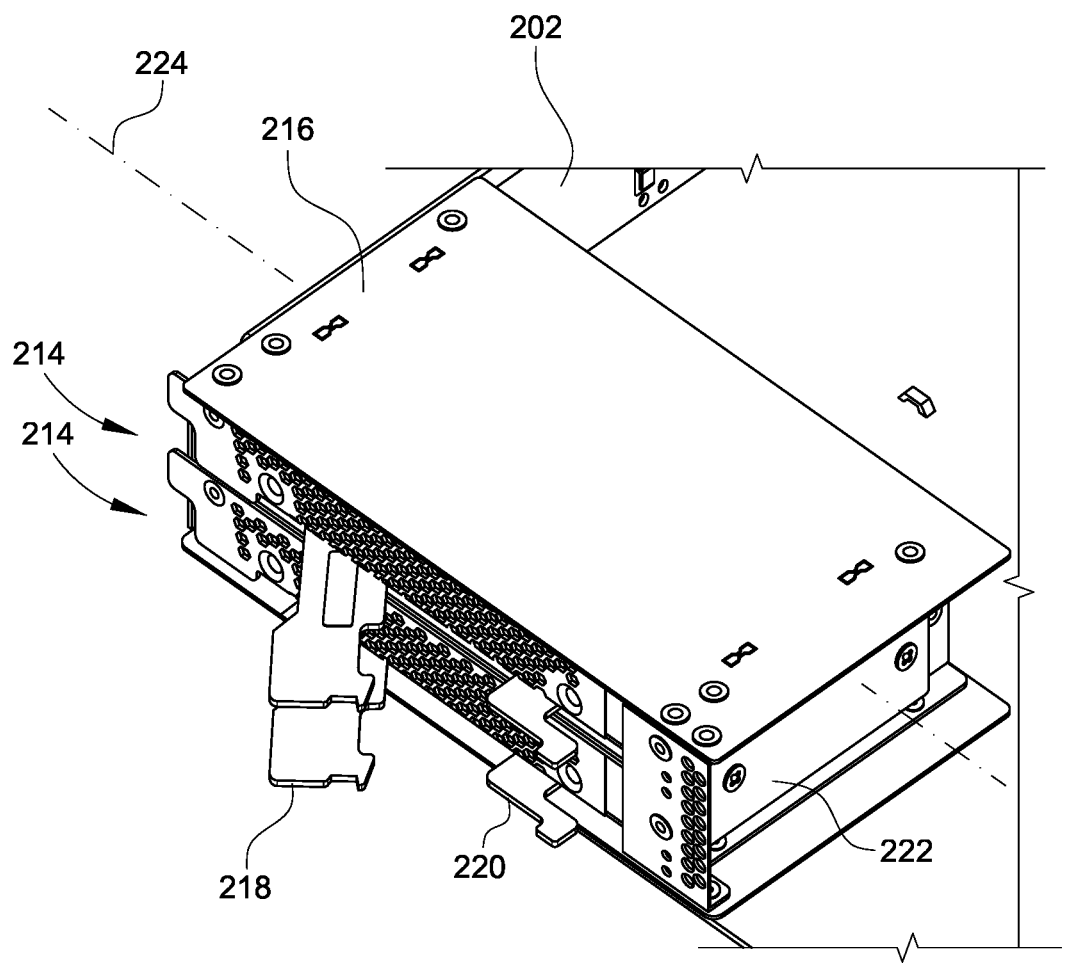
FIG. 2 is an isometric view of a portion of a computer chassis with a transverse drive tray assembly, according to certain aspects of the present disclosure.

FIG. 2 is an isometric view of a portion of a computer chassis 202 with a transverse drive tray assembly 214, according to certain aspects of the present disclosure. Various components of the computer chassis 202, such as the top cover, are not depicted for illustrative purposes. The computer chassis 202 can be any suitable computer chassis, such as computer chassis 102 of FIG. 1. Drive tray assembly 214 can be any suitable drive tray assembly, such as drive tray assembly 114 of FIG. 1.

Two drive tray assemblies 214 are depicted, each received within respect receiving spaces of a drive frame 216. The drive frame can be coupled to the computer chassis 202 or otherwise formed thereof. A drive backplane 222 is coupled to the drive frame 216 such that its drive connector(s) face towards the receiving space(s) of the drive frame 216 (e.g., the drive connectors are on the face of the drive backplane 222 facing the top left corner of FIG. 2).

As depicted in FIG. 2, the drives within the drive tray assemblies 214 would have their connectors exposed towards the drive backplane 222 (e.g., towards the bottom-right of the figure). As depicted, each of the drive tray assemblies 214 is shown in an inserted state, but not a fully installed state. Each installation lever 218 of its respective drive tray assembly 214 is still in an open position. Rotating the installation lever 218 towards a closed position (e.g., rotating the exposed, free end of the installation lever 218 towards the drive tray assembly) can cause the drive tray assembly 214 to move in a transverse direction (e.g., a direction along transverse axis 224) due to interaction of the lever with the drive frame, as disclosed in further detail herein. This movement in the transverse direction will cause the drive to communicatively engage the drive backplane 222 (e.g., the connector of the drive to engage the corresponding connector of the drive backplane 222). When fully installed, the installation lever 218 can interact with the release lever 220 to secure the installation lever 218 in its closed position, thus ensuring the drive remains connected to the drive backplane 222 and ensuring the drive tray assembly 214 cannot be prematurely removed. When the installation lever 218 is secured (e.g., locked) in place by the release lever 220, manipulation of the release lever 220 (e.g., depressing the release lever 220 such as by pushing on its free end in a longitudinal direction) can unlock the installation lever 218, allowing it to rotate outwards towards the position seen in FIG. 2.

While described herein as levers, the installation lever 218 and release lever 220 can be enacted in any suitable form, such as buttons, linkages, or other mechanisms, to accomplish the same overall actions.

While depicted with two drive tray assemblies 214, any number of drive tray assemblies 214 can be used. While depicted in a horizontal orientation (e.g., the widest face of the drives facing up and down), that need not always be the case. In some cases, the widest face of the drives may face the sidewalls of the computer chassis 202, with the connector of the drive facing up or down. In such cases, the connection direction of the drive (e.g., the direction in which the drive is moved to have hits connector communicatively coupled to the corresponding connector of the drive backplane) can still be perpendicular to the insertion direction of the drive tray assembly 214 (e.g., the longitudinal direction of the computer chassis 202).

Figure 3:
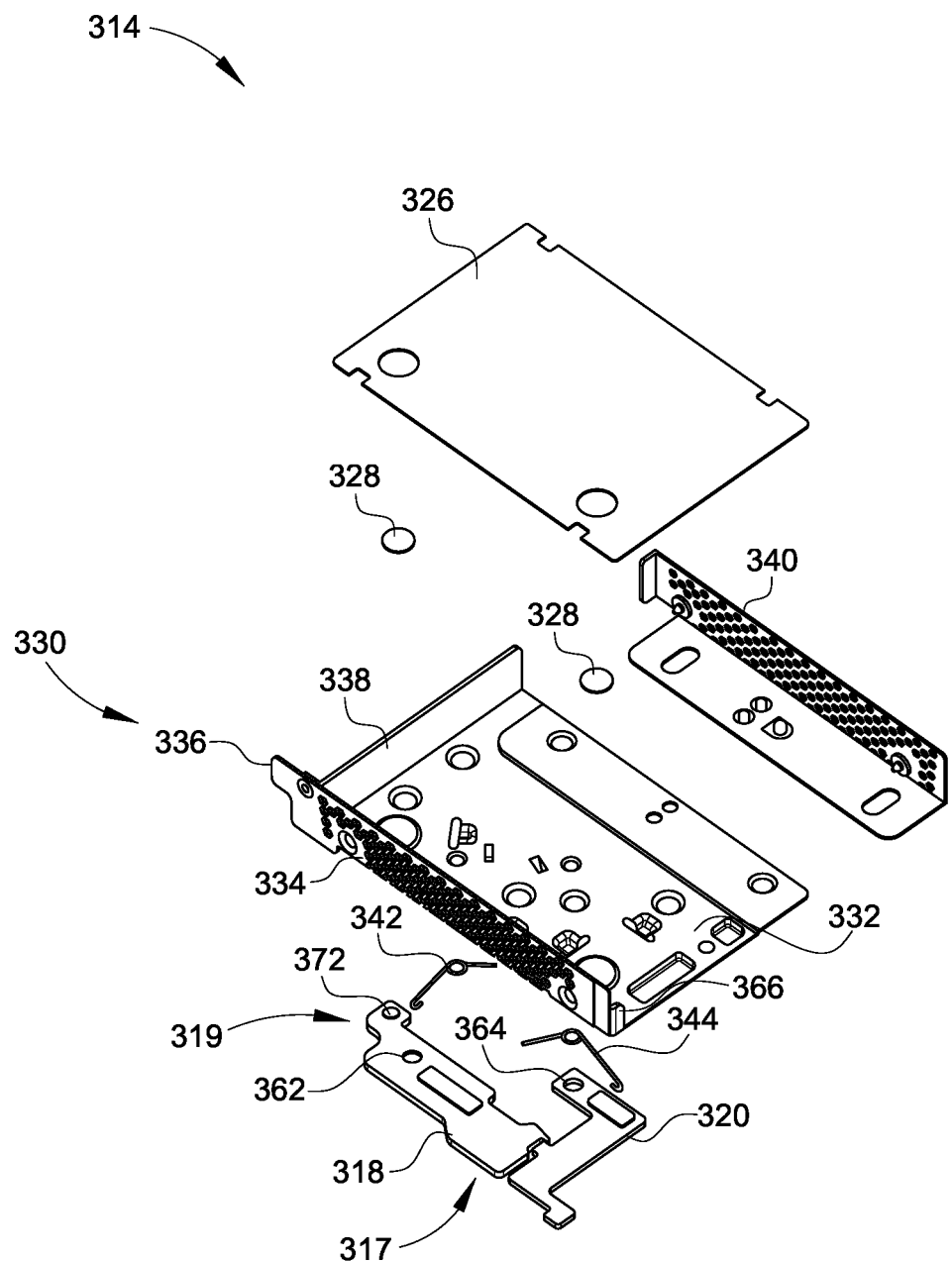
FIG. 3 is an isometric exploded view of a drive tray assembly, according to certain aspects of the present disclosure.

FIG. 3 is an isometric exploded view of a drive tray assembly 314, according to certain aspects of the present disclosure. Drive tray assembly 314 can be any suitable drive tray assembly, such as drive tray assembly 114 of FIG. 1.

The drive tray assembly 314 can include a tray base 330, which can form the primary structure of the drive tray assembly 314. The tray base can include a side face 338, front face 334, a top surface 332, and a retention tab 366, any combination of which can be formed of separate parts coupled together or as a single part (e.g., stamped metal). The retention tab 366 can constrain the drive from moving too far to one side (e.g., too far towards the bottom right of FIG. 3). As described in further detail herein, retention pegs on the front face 334 and/or slidable wall 340 can constrain the drive from undesired movement. In some cases, the side face 338 can also constrain the drive from undesired movement. The front face 334 can further include a tab 336, which can extend past the side face 338, thus easily indicating when the drive tray assembly 314 is not fully installed (e.g., the installation lever 318 is not yet in a closed position) and facilitating handling of the drive tray assembly 314. For descriptive purposes, the terms "side," "front," "top," and "bottom" are used to describe relative directions of the drive tray assembly 314 as viewed in FIG. 3, although other terms can be used. As the relative direction descriptors are used, the side wall 338 of the drive tray assembly 314 is positioned to be adjacent to the end (e.g., a front end or rear end) of the drive opposite the drive's connector of a drive received by the drive tray assembly 314. Likewise, a front face 334 of the drive tray assembly 314 is positioned to be adjacent to a side of a drive received by the drive tray assembly 314.

An installation lever 318 can be coupled to the tray base 330 on a bottom surface (e.g., a surface opposite the top surface 332). The installation lever 318 can be coupled at a pivot 362. As depicted, the pivot 362 takes the form of an aperture through which a rivet or other fastener secures the installation lever 318 to a corresponding aperture of the tray base 330 in a manner that allows the installation lever 318 to rotate about the pivot 362. A biasing device 342 (e.g., a spring) can be used to bias the installation lever 318 towards an open position. As depicted in the exploded view of FIG. 3, the installation lever 318 is in a closed position, held locked in place by the release lever 320. Thus, when the release lever 320 is moved to unlock the installation lever 318, the installation lever 318 will automatically be biased towards the open position by the biasing device 342.

The installation lever 318 can have a first arm 317 and a second arm 319. The first arm 317 can be used as a handle to manipulate the installation lever 318, such as to help move it towards an open or closed position, or to grasp the installation lever 318 to facilitate pulling the drive tray assembly 314 out of a receiving space. The second arm 318 can extend away from the pivot 362 by a distance and can include a shaft 372 that extends away from the tray base 330 (e.g., in a downward direction as depicted in FIG. 3). The shaft 372 can be formed as part of the installation lever 318 (e.g., as a boss) or a can be coupled to the installation lever 318 (e.g., as a rivet or standoff). Rotation of the first arm 317 about the pivot 362 thus causes corresponding rotation of the second arm 319, and thus the shaft 372, about the pivot 362. As used herein, the term shaft with respect to a shaft that is received by a slot is inclusive of shafts of any shape (e.g., cylindrical, rectangular, etc.), and any termination (e.g., straight shafts, T-shaped shafts or shafts with endcaps or other fasteners that vertically constrain movement of the shaft when received by a slot).

Release lever 320 can likewise by coupled to the tray base 330 by its own pivot 364 (e.g., an aperture through which a rivet or other fastener secures the release lever 320 to a corresponding aperture of the tray base 330 in a manner that allows the release lever 320 to rotate about the pivot 364). As described in further detail herein, the release lever 320 can have a locking mechanism that engages the installation lever 318 to lock the installation lever 318 in a closed position until the release lever 320 is actuated (e.g., depressed or otherwise caused to rotate about its pivot 364 away from a locking position). A biasing device 344 (e.g., a spring) can bias the release lever 320 towards its locking position.

In some cases, a tray base 330 can include additional walls (e.g., a rear wall) or other features to assist securing the drive to the tray base 330. In some cases, as described in further detail herein, a slidable wall 340 can be slidably coupled to the tray base 330 to help retain a drive within the tray base 330.

In some cases, a protection layer 326 and/or spacers 328 can be placed over the tray base 330 to add a layer of mechanical and/or electrostatic protection between the tray base 330 and the drive to be placed therein. For example, a protection layer 326 can be made of mylar or another suitable material to provide electrostatic protection. As another example, spacers 328 can be made of a rubber or other suitable material to provide mechanical protection (e.g., from vibrations).

Figure 4:
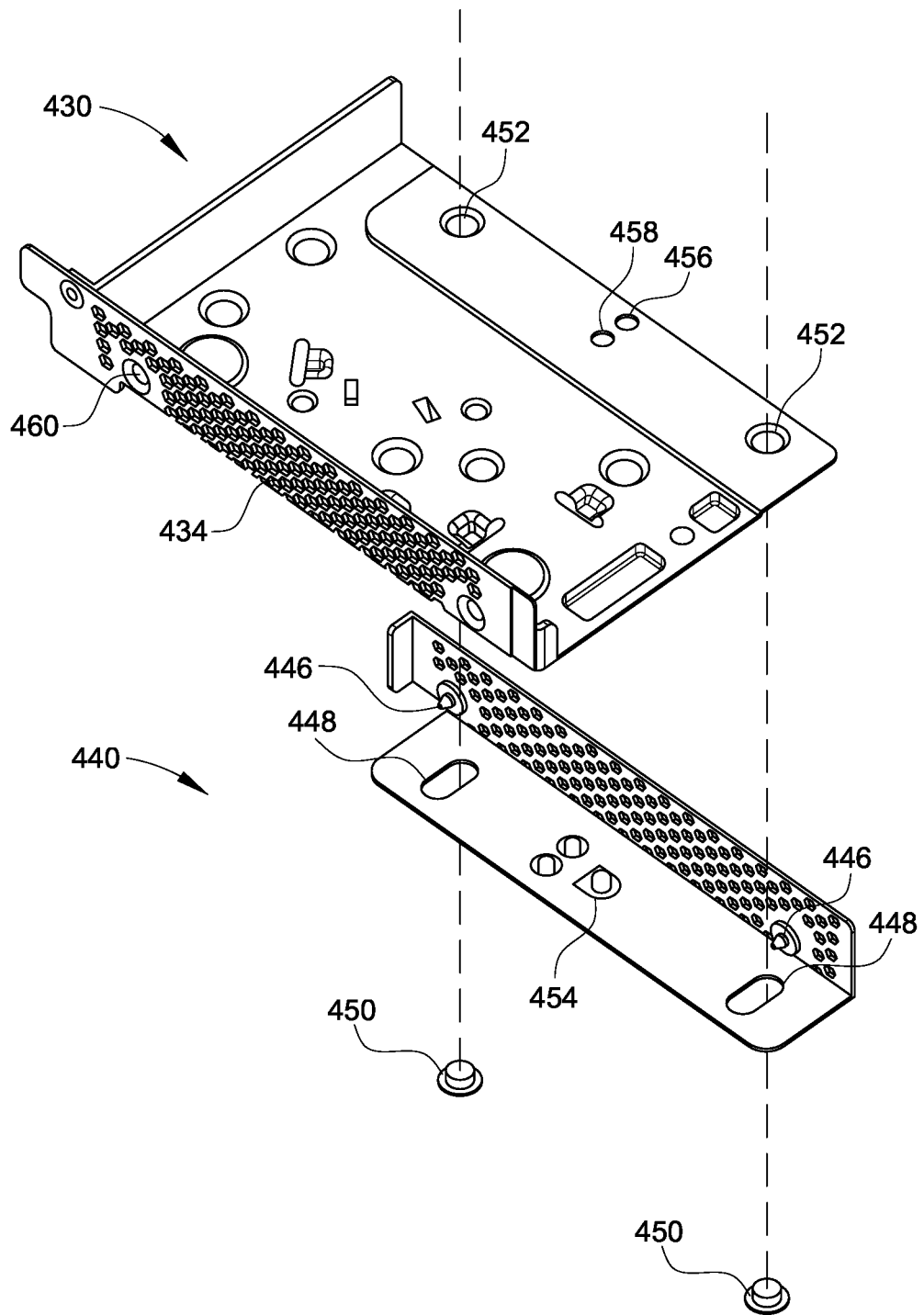
FIG. 4 is an isometric exploded view of a tray base and a slidable wall, according to certain aspects of the present disclosure.

FIG. 4 is an isometric exploded view of a tray base 430 and a slidable wall 440, according to certain aspects of the present disclosure. The tray base 430 and slidable wall 440 can be tray base 330 and slidable wall 340 of FIG. 3, respectively.

The slidable wall 440 can be slidably coupled to the tray base 430 to slide towards and away from the tray base 430. As depicted in FIG. 4, the slidable wall 440 can include a set of elongated apertures 448, each of which can be fastened to corresponding apertures 452 of the tray base 430, such as using rivets 450. The slidable wall 440 can be fastened such that the fasteners slide within the elongated apertures 448 of the slidable wall 440, thus permitting the slidable wall 440 to slide towards and away from the tray base 430.

The slidable wall 440 can include one or more (e.g., two) retention pegs 446. Each retention peg 446 can be formed from the material of the slidable wall 440 or can be separately formed and coupled to the slidable wall 440. Each retention peg 446 can be positioned in a location that corresponds to a respective mounting hole of a drive to be received by the drive tray assembly. For example, a standard hard disk drive has a standard spacing of side mounting holes. The slidable wall 440 can have its retention pegs 446 positioned in that standard spacing, thus permitting the retention pegs 446 to engage (e.g., fit within) the mounting holes of the drive when the slidable wall 440 is moved towards a retracted position (e.g., towards the tray base 430). When the retention pegs 446 engage their respective mounting holes, the drive can be constrained from undesired movement. In some cases, the tray base 430 can include additional retention pegs 460 on its front face 434. In some cases, these additional retention pegs 460 are located in positions that correspond wot the retention pegs 446 of the slidable wall 440.

The slidable wall 440 can be moved between a retracted position (e.g., a position closest to the tray base 430, where the retention pegs 446 engage the drive) and an extended position (e.g., a position furthest from the tray base 430, where the retention pegs 446 no longer engage the drive). In some cases, the slidable wall 440 can include a temporary holding mechanism designed to temporarily hold the slidable wall 440 in one or both of the retracted position and extended position. In some cases, the slidable wall 440 can be temporarily held in place by a detent mechanism. A biasing device 454 coupled to or formed from the slidable wall 440 can be biased to engage a detent 458 (e.g., an indentation, aperture, or other suitable feature) of the tray base 430 when the biasing device 454 is in its retracted position, thus holding the slidable wall 440 in a position in which a drive received by the drive tray assembly is constrained in place by the retention pegs 446. When a user wishes to remove the drive, manual force can be applied to overcome the biasing device 454 and move the slidable wall 440 to its extended position. In some cases, an additional detent 456 can be used to temporarily hold the slidable wall 440 in its extended position, thus facilitating installation of a new drive. Any suitable biasing device 454 can be used, such as a ball (e.g., a spring-biased sphere or half-sphere), a roller, or another detent-engaging biasing device.

Figure 5:
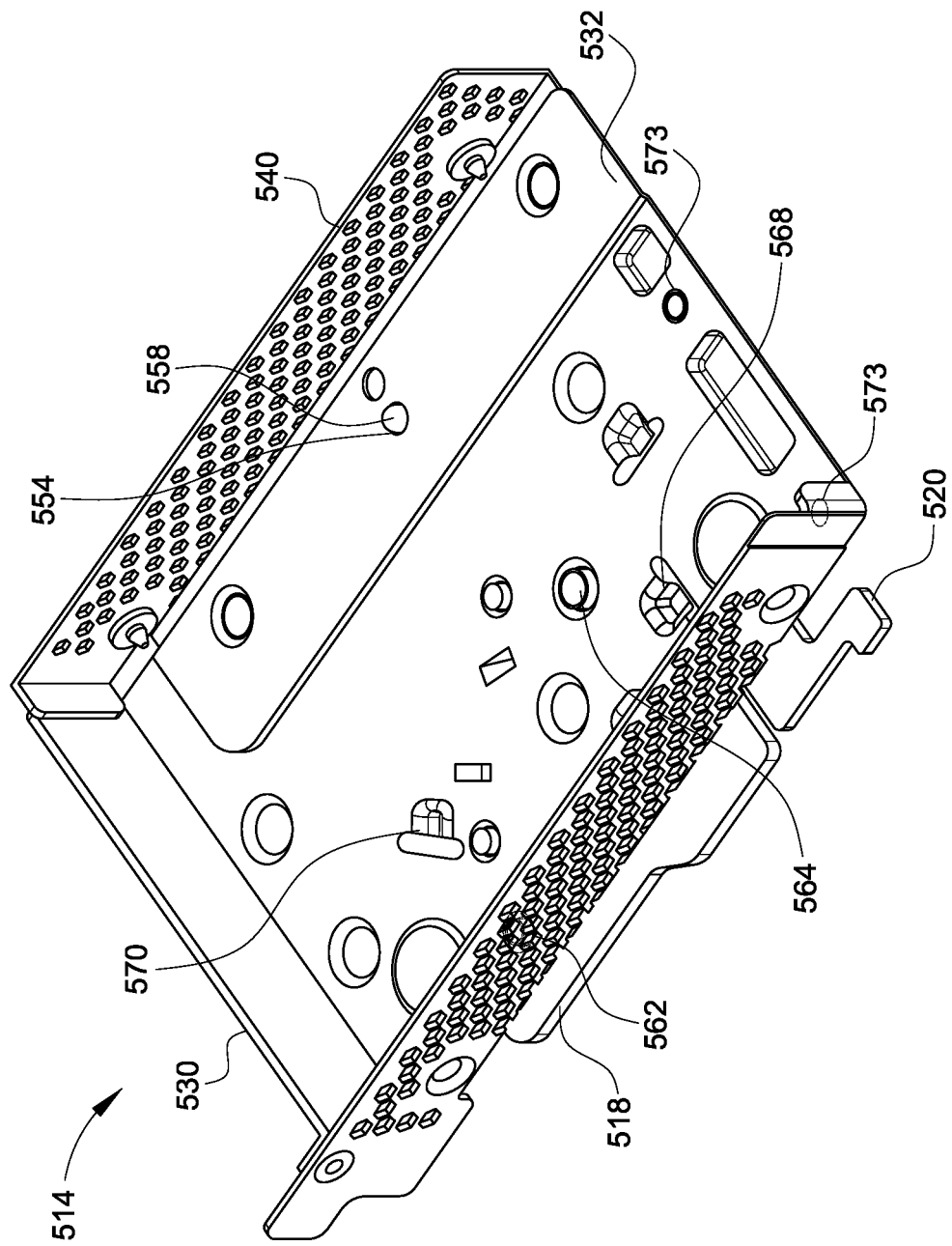
FIG. 5 is an isometric view of a drive tray assembly with a slidable wall, according to certain aspects of the present disclosure.

FIG. 5 is an isometric view of a drive tray assembly 514 with a slidable wall 540, according to certain aspects of the present disclosure. Drive tray assembly 514 can be any suitable drive tray assembly, such as drive tray assembly 114 of FIG. 1.

The slidable wall 540 is depicted in its retracted position, with its retaining device 554 received by a detent 558. The installation lever 518 is coupled to the tray base 530 at its pivot 562. Likewise, the release lever 520 is coupled to the tray base 530 at its pivot 564.

In some cases, the top surface 532 (and/or corresponding bottom surface) of the tray base 530 can include additional features built into or coupled to the top surface 532, such as retention pegs (not shown) for engaging bottom mounting holes of a drive, endstops 568, 570, additional shafts (e.g., shaft 573), and/or other indentations or extrusions (e.g., to facilitate alignment of the tray base 530 during installation). For example, an endstop 568 can be positioned to stop the release lever 520 from rotating past its locking position. As another example, an endstop 570 can stop the installation lever 518 from travelling past its open position, which can beneficially ensure its shaft remains in an expected position during installation.

In some cases, one or more additional shafts 573 (e.g., bosses, standoffs, rivets, or the like) can extend from the bottom surface of the tray base 530 in a direction away from where the drive is received (e.g., in a downward direction). As described in further detail herein, these additional shafts 573 can engage a corresponding slot in an alignment plate to facilitate proper alignment of the drive tray assembly 514 during assembly, as well as to facilitate securing the drive tray assembly 514 from removal while the drive is connected to the drive backplane. As depicted in FIG. 5, the drive tray assembly 514 includes two additional shafts 573, one of which is depicted in dashed lines since it is visually obscured by other portions of the tray base 530.

Figure 6:
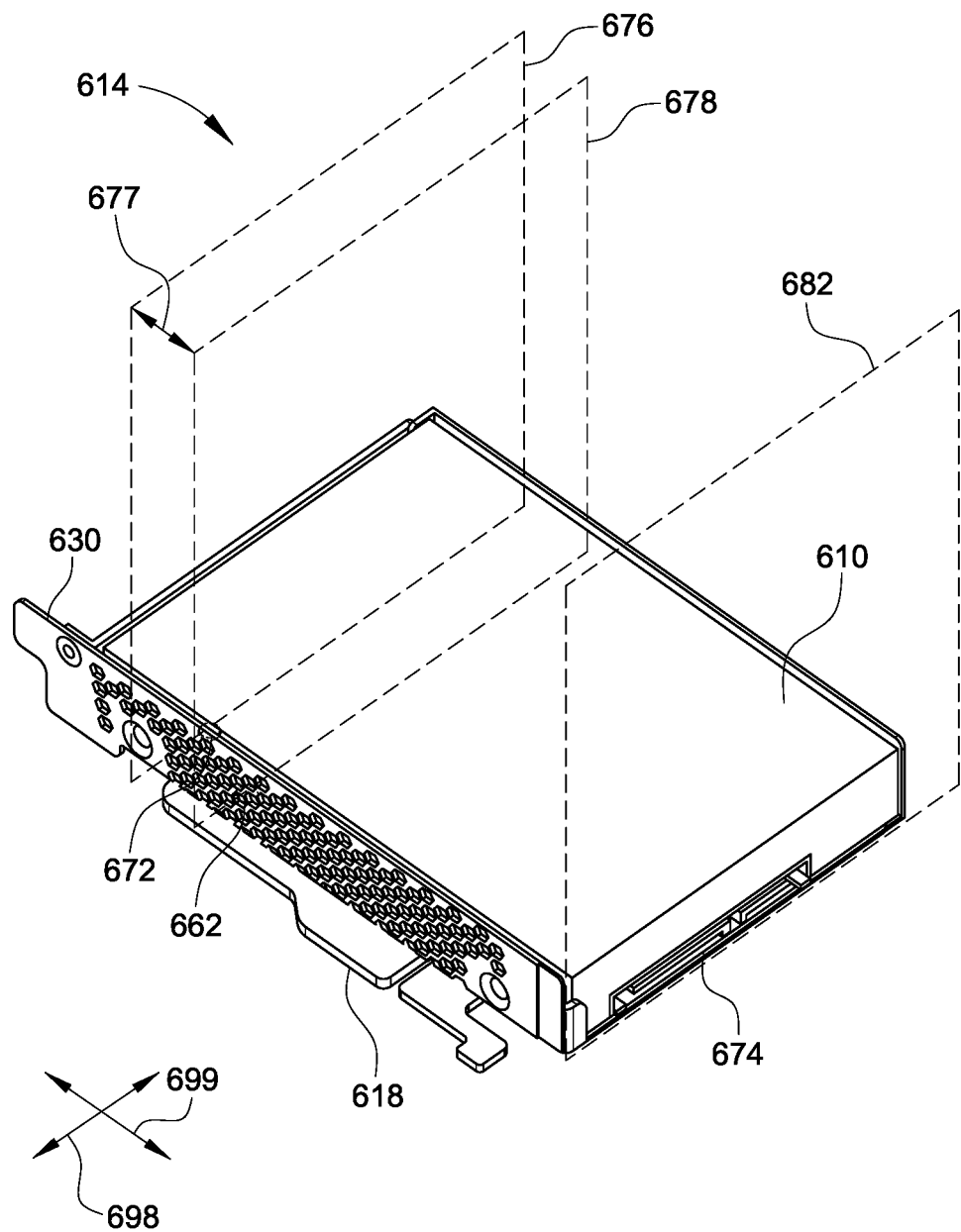
FIG. 6 is an isometric view of a drive tray assembly with a drive installed therein, according to certain aspects of the present disclosure.

FIG. 6 is an isometric view of a drive tray assembly 614 with a drive 610 installed therein, according to certain aspects of the present disclosure. Drive tray assembly 614 can be any suitable drive tray assembly, such as drive tray assembly 114 of FIG. 1. The drive 610 is installed in the drive tray assembly 614 (e.g., secured in place by retention pegs of the drive tray and slidable wall engaging its side mounting holes). For illustrative purposes, the longitudinal direction 698 refers to the longitudinal direction of the computer chassis in which the drive tray assembly 614 is to be installed (e.g., a direction from the front to the rear of the computer chassis), and the transverse direction 699 refers to a direction perpendicular to the longitudinal direction. The transverse direction 699 can be a direction that extends between the sidewalls of a computer chassis (e.g., parallel to the front face and/or rear face of the computer chassis).

The drive includes a connector 674 that connectively faces a transverse direction 699 towards a bottom right of FIG. 6. As used herein, the term connectively face can refer to a direction in which a device is moved to have its connector engage a receiving connector. For example, the drives 109 of FIG. 1 connectively face a rear end of the computer chassis 101 of FIG. 1 (e.g., towards the top of FIG. 1), whereas the drives 110 of FIG. 1 connectively face a side of the computer chassis 102 of FIG. 1 (e.g., towards a right side of FIG. 1). A connector plane 682 can be defined as a plane that passes through the connector 674 (e.g., at an end of the connector 674) and is parallel to the longitudinal direction 698. The connector plane 682 can be perpendicular to the transverse direction 699. In some cases, the connector plane 682 can be defined as a plane that passes through the connector 674, is perpendicular to a top surface of the tray base 630, and is parallel to a side face of the tray base 630.

A pivot plane 678 can be defined as a plane that passes through the pivot 662 of the installation lever 618 (e.g., the center of the pivot 662) and is parallel to the connector plane 682. The pivot plane 678 can be parallel to the longitudinal direction 698. The pivot plane 678 can be perpendicular to the transverse direction 699. In some cases, the pivot plane 678 can be defined as a plane that passes through the pivot 662 of the installation lever 618, is perpendicular to a top surface of the tray base 630, and is parallel to a side face of the tray base 630.

A shaft plane 676 can be defined as a plane that passes through the shaft 672 of the installation lever 618 (e.g., the center of the shaft 672) and is parallel to the pivot plane 678. The shaft plane 676 can be parallel to the longitudinal direction 698. The shaft plane 676 can be perpendicular to the transverse direction 699. In some cases, the shaft plane 676 can be defined as a plane that passes through the shaft 672 of the installation lever 618, is perpendicular to a top surface of the tray base 630, and is parallel to a side face of the tray base 630.

While the distance between the shaft 672 and the pivot 660 of the installation lever 618 remains constant, the distance 677 between the shaft plane 676 and the installation plane 678 will change depending on the position of the installation lever 618. For example, movement of the installation lever 618 from a closed position (e.g., as depicted in FIG. 6) to an open position (e.g., as depicted by the installation lever 218 of FIG. 2) will cause the distance 677 between the pivot plane 678 and the shaft plane 676 to decrease. Likewise, movement of the installation lever 618 from an open position to a closed position will cause the distance 677 between the pivot plane 678 and the shaft plane 676 to increase.

Since the drive 610 is secured to the tray base 630 and the pivot 662 of the installation lever 618 is secured to the tray base 630, the distance between the connector 674 and the pivot 662 remains constant. Thus, the distance between the pivot plane 678 and the connector plane 682 remains constant. Therefore, movement of the installation lever 618 between the open and closed positions causes the connector plane 682 to move closer to or further from the shaft plane 676.

As described in further detail herein, the shaft 672 is received by an alignment plate that is coupled to the computer chassis, thus allowing the drive tray assembly 614 to manipulate the drive 610 in a transverse direction 699 merely by moving the installation lever 618 between its open and closed positions.

Figure 7:
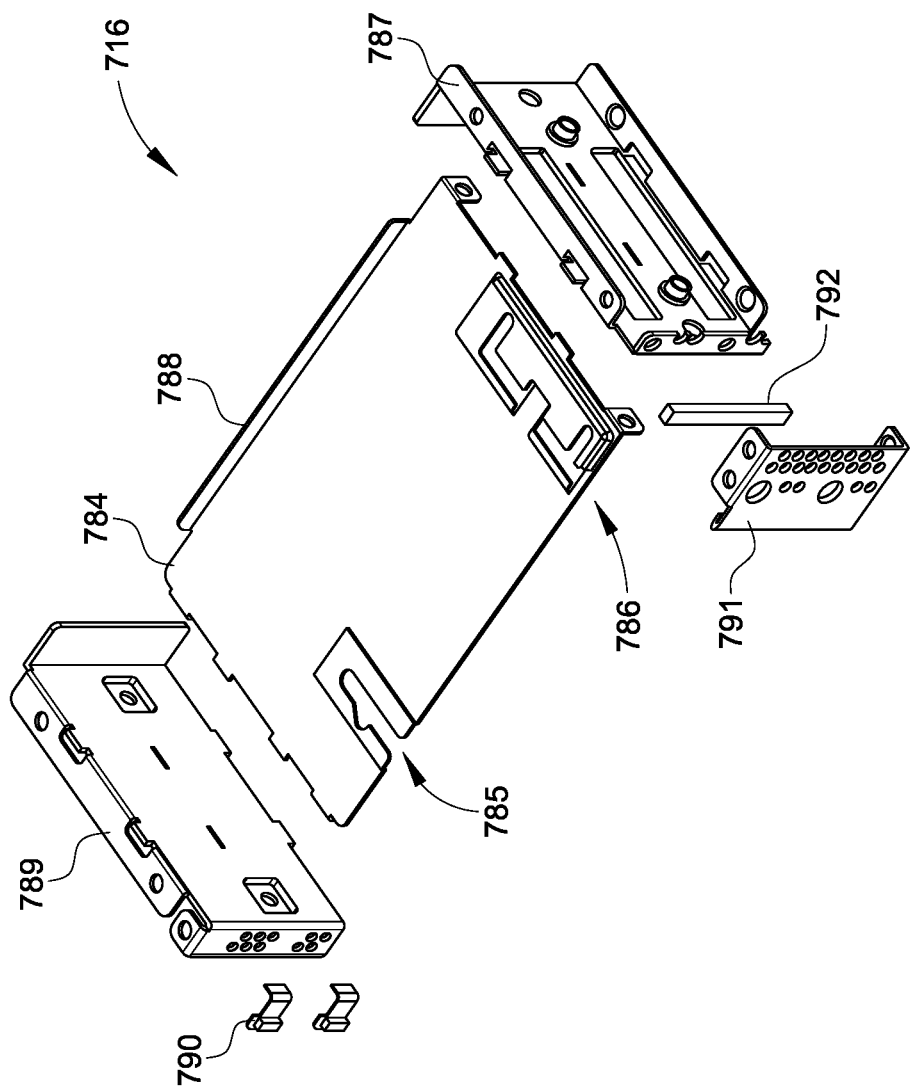
FIG. 7 is an isometric exploded view of portions of a drive frame, according to certain aspects of the present disclosure.

FIG. 7 is an isometric exploded view of portions of a drive frame 716, according to certain aspects of the present disclosure. Drive frame 716 can be any suitable drive frame, such as drive frame 216 of FIG. 2. Certain portions of the drive frame 716 are not depicted for illustrative purposes.

The drive frame 716 can include a first side plate 789 and a second side plate 787. The second side plate 787 can include mounting holes and/or other features for receiving and/or mounting a drive backplane. Holes in the second side plate 787 can permit the connector of a drive and/or connector of a drive backplane to pass through the second side plate 787 and thus facilitate connection of the drive. In some cases, a front plate 791 can be formed with or coupled to the second side plate 787, such as to provide additional covering for keeping debris out of the inside of the computer chassis. In some cases, gaskets 790, 792 can be used to improve the mechanical and/or electrostatic properties of the drive frame 716 (e.g., to reduce the transmission of vibrations between a drive and other components of the computing system.

An alignment plate 784 can be positioned between the first side plate 789 and second side plate 787. The alignment plate 784 can include a first receiving slot 785 for receiving the shaft of an installation lever. In some cases, the alignment plate 784 can include one or more additional slots 786 for receiving additional shafts (e.g., additional shafts 573 of FIG. 5). In some cases, the alignment plate 784 can include a rear endstop 788. The rear endstop 788 can facilitate constraining insertion of the drive tray assembly past a defined point. In some cases, the side plates 787, 789 can also include respective endstops.

Figure 8:
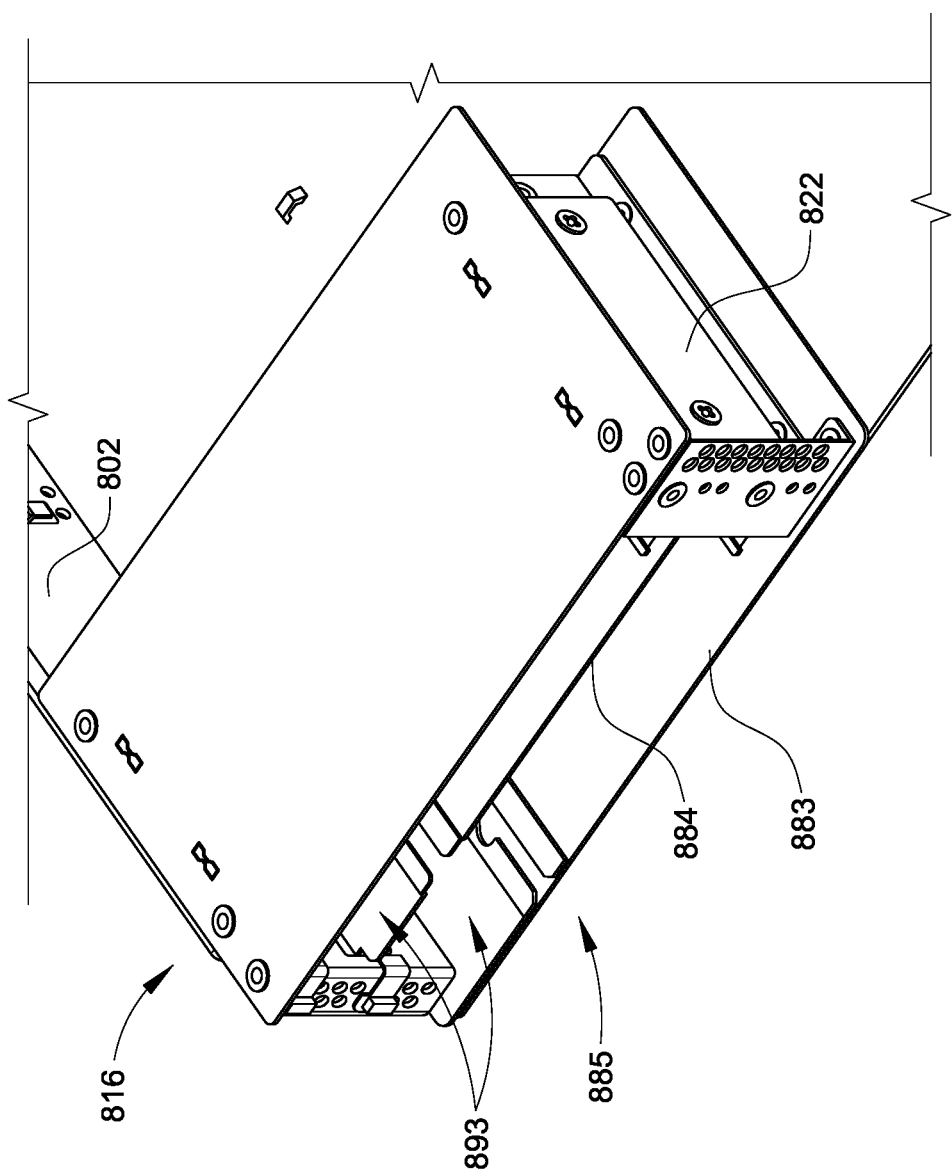
FIG. 8 is an isometric view of a portion of a computer chassis with a drive frame, according to certain aspects of the present disclosure.

FIG. 8 is an isometric view of a portion of a computer chassis 802 with a drive frame 816, according to certain aspects of the present disclosure. Drive frame 816 can be any suitable drive frame, such as drive frame 216 of FIG. 2. The drive frame 816 can be formed of and/or coupled to the computer chassis 802. The drive backplane 822 is depicted coupled to the drive frame 816.

As depicted in FIG. 8, the drive frame 816 includes two receiving spaces 893, each capable of receiving a respective drive tray assembly. Each receiving space 893 includes a respective receiving slot 885 for receiving the shaft of the installation lever of the drive tray assembly. In a drive frame 816 having two receiving spaces 893, two alignment plates 883, 884 are used. A bottom alignment plate 883 can be positioned at the bottom of the drive frame 816, and can be formed in the computer chassis 802 (e.g., receiving slot 885 formed in the computer chassis 802) or otherwise coupled to it (e.g., formed as a plate supported by side plates of the drive frame, which are coupled to the computer chassis 802).

A partition alignment plate 884 can be supported by the side plates of the drive frame 816 and can separate two receiving spaces 893. In some cases, additional partitions can be used, although that need not always be the case.

Figure 9:
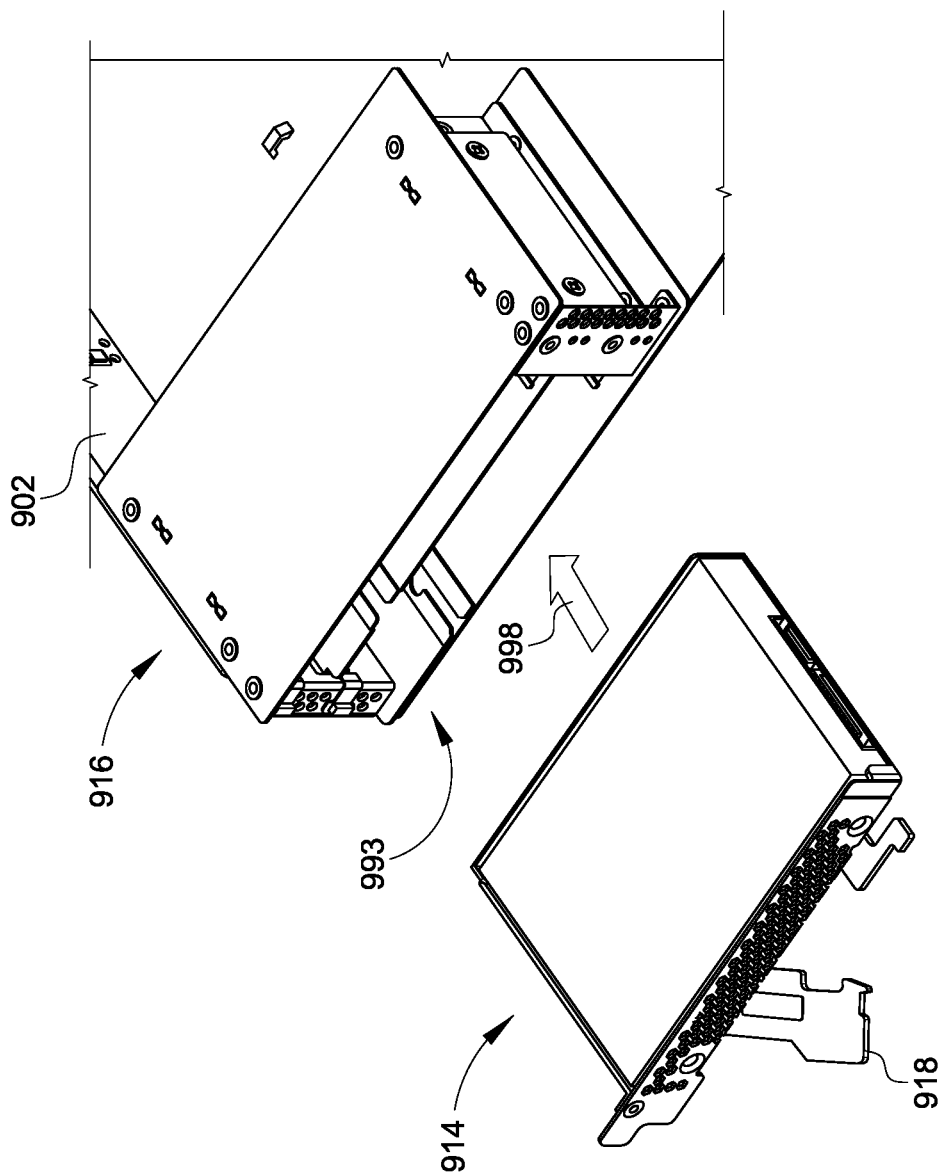
FIG. 9 is an isometric view of a portion of a computer chassis during installation of a drive tray assembly into a drive frame, according to certain aspects of the present disclosure.

FIG. 9 is an isometric view of a portion of a computer chassis 902 during installation of a drive tray assembly 914 into a drive frame, according to certain aspects of the present disclosure. The computer chassis 902 and drive tray assembly 914 can be any suitable computer chassis and drive tray assembly, such as computer chassis 102 and drive tray assembly 114 of FIG. 1.

The installation lever 918 of the drive tray assembly 914 is in the open position as the drive tray assembly 914 is moved in a longitudinal direction 998 towards a receiving space 993 of the drive frame 916.

Figure 10:
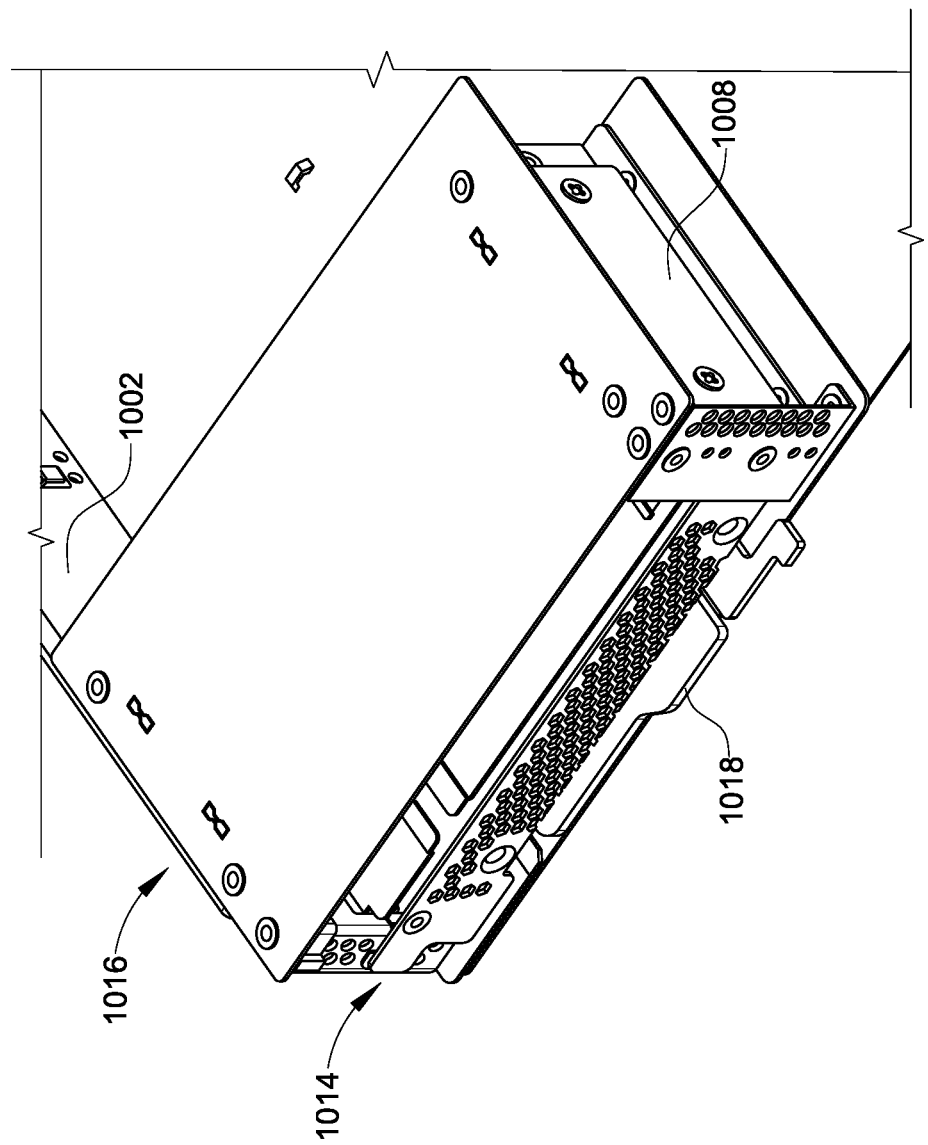
FIG. 10 is an isometric view of a portion of the computer chassis with a drive tray assembly installed in a drive frame, according to certain aspects of the present disclosure.

FIG. 10 is an isometric view of a portion of the computer chassis 1002 with a drive tray assembly 1014 installed in a drive frame 1016, according to certain aspects of the present disclosure. The computer chassis 1002 of FIG. 10 can be computer chassis 902 of FIG. 9 after insertion and installation of the drive tray assembly 1014.

After the drive tray assembly 1014 was inserted into the receiving slot, the installation lever 1018 was rotated to its closed position, as depicted in FIG. 10. Rotation from the open position to the closed position caused the drive tray assembly 1014 to move transversely with respect to the computer chassis 1002, and thus with respect to the drive backplane 1008. This movement facilitate connection between the connector of the drive within the drive tray assembly 1014 and the corresponding connector of the drive backplane 1008.

Figure 11:
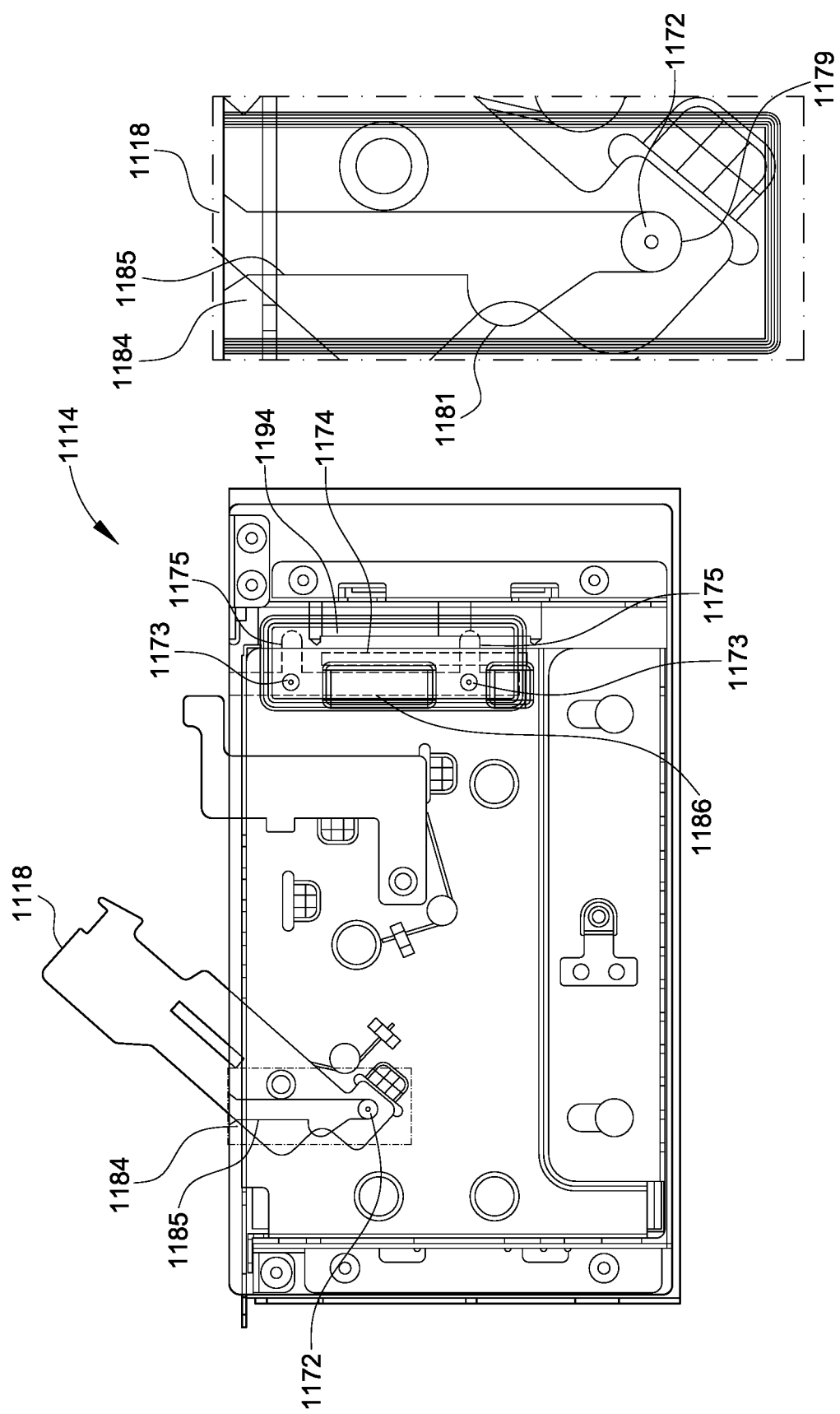
FIG. 11 is a combination bottom view and close-up bottom view of a drive tray assembly during installation in a drive frame, according to certain aspects of the present disclosure.

FIG. 11 is a combination bottom view and close-up bottom view of a drive tray assembly 1114 during installation in a drive frame, according to certain aspects of the present disclosure. The drive tray assembly 1114 can be drive tray assembly 1014 of FIG. 10 after insertion but before the installation lever 1118 was rotated away from its open position. The close-up view is of the portion of the bottom view around the receiving slot 1185, as indicated by the dot-dashed box. For illustrative purposes, certain portions of the drive frame (e.g., the alignment plate) are depicted as translucent or transparent.

The shaft 1172 of the installation lever 1118 is shown received by receiving slot 1185. More specifically, the shaft 1172 has been inserted up to an endpoint 1179 in the receiving slot 1185. The receiving slot 1185 can extend generally longitudinally (e.g., in a direction from the top to the bottom of FIG. 11) from a front edge of the alignment plate 1184 towards a far end of the computer chassis. The receiving slot 1185 can include an additional endpoint 1181 for receiving and engaging the shaft 1172 during the installation procedure. The additional endpoint 1181 can be located between the front edge of the alignment plate 1184 and the endpoint 1179 and offset, in a direction away from the drive backplane, from a line formed between the opening of the receiving slot 1185 and the endpoint 1179. The position of the additional endpoint 1181 and path of the receiving slot 1185 between the endpoint 1179 and additional endpoint 1181 can be configured to permit the drive tray assembly 1114 to move only in the transverse direction (e.g., left-right direction as seen in FIG. 11) in response to movement of the installation lever 1118 between the open and closed positions, thus avoiding undesired movement in the longitudinal direction (e.g., up-down direction as seen in FIG. 11).

The drive tray assembly 1114 can include additional shafts 1173, which are received by additional receiving slot

1186. As depicted in FIG. 11, two additional shafts 1173 are used in parallel, permitting both of the additional shafts 1173 to be received by the same additional receiving slot 1186. The additional receiving slot 1186 can help constrain undesired movement (e.g., undesired transverse movement) of the drive tray assembly 1114 during insertion. However, to permit the drive tray assembly 1114 to move transversely after insertion, a perpendicular slot 1175 extends in a transverse direction off of the additional receiving slot 1186 for each of the additional shafts 1173. Thus, when the installation lever 1118 is moved to the closed position, the additional shafts 1173 travel along their respective perpendicular slots 1175.

Since the installation lever 1118 is still in its open position, the connector 1174 of the drive is not yet engaged with the corresponding connector 1194 of the drive backplane.

Figure 12:
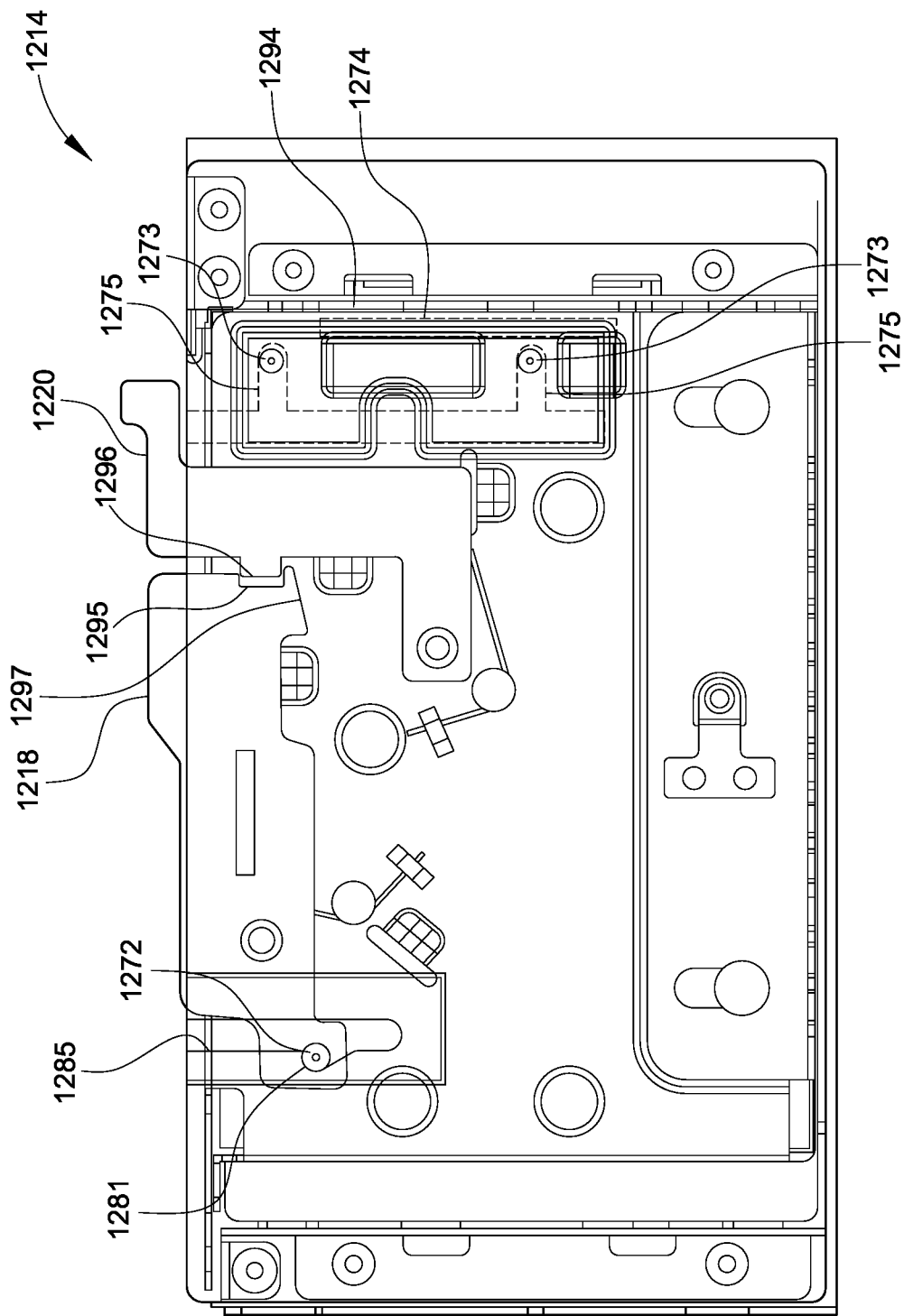
FIG. 12 is a bottom view of a drive tray assembly installed in a drive frame, according to certain aspects of the present disclosure.

FIG. 12 is a bottom view of a drive tray assembly 1214 installed in a drive frame, according to certain aspects of the present disclosure. The drive tray assembly 1214 can be drive tray assembly 1114 of FIG. 11 after the installation lever 1218 has been moved to the closed position.

By moving the installation lever 1218 to the closed position, the shaft 1272 of the installation lever 1218 has slid up and been caught by the endpoint 1281 of the receiving slot 1285. The interaction between the shaft 1272 and the endpoint 1281 can help constrain the drive tray assembly 1214 from undesired movement in the longitudinal direction out of the computer chassis (e.g., towards the top of FIG. 12).

Movement of the installation lever 1218 to the closed position has also caused the additional shafts 1273 of the drive tray assembly 1214 to move into the perpendicular slots 1275. Interaction between the additional shafts 1273 and the perpendicular slots 1275 can help constrain the drive tray assembly from undesired movement in the longitudinal direction out of the computer chassis (e.g., towards the top of FIG. 12).

Movement of the installation lever 1218 to the closed position has also caused the connector 1274 of the drive to communicatively engage the receiving connector 1294 of the drive backplane.

Movement of the installation lever 1218 to the closed position has also resulted in a locking surface 1295 of the installation lever 1218 engaging a corresponding locking surface 1296 of the release lever 1220. As depicted in FIG. 12, the locking surfaces 1295, 1296 are corresponding features that prevent the installation lever 1218 from moving out of the closed position until the release lever 1220 has rotated away from the installation lever 1218. The locking surface 1295 of the installation lever 1218 can be a receiving space that receives an extended portion of the release lever 1220 serving as its locking surface 1296. In some cases, the locking surface 1295 can include an inclined plane 1297 used to induce rotation of the release lever 1220 out of its locking position as the installation lever 1218 moves into its closed position. Once the installation lever 1218 is in its closed position, the biasing element of the release lever 1220 causes the release lever 1220 to move back to its locking position (e.g., the position depicted in FIG. 12) in which its locking surface 1296 engages the locking surface 1295 of the installation lever 1218.

The foregoing description of the embodiments, including illustrated embodiments, has been presented only for the purpose of illustration and description and is not intended to be exhaustive or limiting to the precise forms disclosed. Numerous modifications, adaptations, and uses thereof will be apparent to those skilled in the art. Numerous changes to the disclosed embodiments can be made in accordance with the disclosure herein, without departing from the spirit or scope of the disclosure. Thus, the breadth and scope of the present disclosure should not be limited by any of the above described embodiments.

Although certain aspects and features of the present disclosure have been illustrated and described with respect to one or more implementations, equivalent alterations and modifications will occur or be known to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only, and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

One or more elements or aspects or steps, or any portion(s) thereof, from one or more of any of claims 1 to 20 below can be combined with one or more elements or aspects or steps, or any portion(s) thereof, from one or more of any of the other claims 1 to 20 or combinations thereof, to form one or more additional implementations and/or claims of the present disclosure.

What is claimed is:

1. A drive tray assembly comprising:
 a tray base slidably insertable into a receiving space of a chassis in a longitudinal direction, the tray base having a top surface for receiving a drive oriented in a transverse direction such that a connector of the drive rests in a connector plane that is parallel to the longitudinal direction; and
 an installation lever rotatably coupled to a bottom surface of the tray base at a pivot, the pivot defining a pivot plane parallel to the connector plane, the installation lever being rotatable between a closed position and an open position, the installation lever having a shaft extending from a lever bottom surface at a position spaced apart from the pivot, the shaft defining a shaft plane parallel to the pivot plane, rotation of the installation lever from the open position to the closed position causing a distance between the pivot plane and the shaft plane to increase, the shaft being insertable into a receiving slot of the receiving space such that rotation of the installation lever from the open position to the closed position causes the connector plane to move away from the shaft plane.

2. The drive tray assembly of claim 1, wherein rotation of the installation lever from the open position to the closed position while the tray base is received by the receiving space causes the connector of the drive to mate with a corresponding connector of a computer system.

3. The drive tray assembly of claim 1, further comprising:
a release lever rotatably coupled to the bottom surface of the tray base at a second pivot, the release lever being rotatable between a locking position and an unlocking position; and
a biasing device coupled to the release lever to bias the release lever towards the locking position, the release lever having a locking surface for engaging a corresponding locking surface of the installation lever when the installation lever is in the closed position and the release lever is in the locking position, the release lever constraining the installation lever from rotation out of the closed position while the release lever is in the locking position, the release lever permitting rotation of the installation lever out of the closed position when the release lever is moved to the unlocking position.

4. The drive tray assembly of claim 1, further comprising a sliding wall slidably coupled to the tray base to move between a disengaged position and an engaged position, the sliding wall having one or more side retention pegs positioned to align with mounting holes of the drive, the one or more side retention pegs engaging the mounting holes of the drive when the drive is received by the tray base and the sliding wall is in the engaged position, the one or more side retention pegs being disengaged from the mounting holes of the drive when the drive is received by the tray base and the sliding wall is in the disengaged position.

5. The drive tray assembly of claim 4, wherein the tray base has a detent for receiving a biasing feature of the sliding wall when the sliding wall is in the engaged position.

6. The drive tray assembly of claim 1, further comprising a drive frame coupled to the chassis, the receiving space of the chassis being a receiving space of the drive frame, the receiving slot being formed in an alignment plate of the drive frame.

7. The drive tray assembly of claim 6, wherein the receiving slot extends in a line from a front of the alignment plate to a first endpoint, the receiving slot having a second endpoint offset from the line, the second endpoint being positioned between the front of the alignment plate and the first endpoint such that, when the tray base is inserted into the receiving space, rotation of the installation lever from the open position to the closed position causes the shaft to engage the second endpoint.

8. The drive tray assembly of claim 6, wherein the alignment plate has an additional receiving slot for receiving one or more additional shafts extending from the bottom surface of the tray base at a position between the connector plane and the shaft plane.

9. The drive tray assembly of claim 8, wherein the additional receiving slot extends in the longitudinal direction from a front of the alignment plate, the additional alignment plate further having, for each of the one or more additional shafts, a respective perpendicular slot extending from the additional receiving slot towards the connector plane.

10. The drive tray assembly of claim 6, wherein the drive frame has a drive backplane coupled thereto, rotation of the installation lever from the open position to the closed position, while the tray base is received by the receiving space, causing the connector of the drive to mate with a corresponding connector of the drive backplane.

11. A method, comprising:
providing a computer chassis having a receiving space and a computing device;
providing a drive tray assembly, the drive tray assembly having:
a tray base slidably insertable into the receiving space of the computer chassis in a longitudinal direction, the tray base having a top surface for receiving a drive oriented in a transverse direction such that a connector of the drive rests in a connector plane that is parallel to the longitudinal direction;
an installation lever rotatably coupled to a bottom surface of the tray base at a pivot, the pivot defining a pivot plane parallel to the connector plane, the installation lever rotatable between a closed position and an open position, the installation lever having a shaft extending from a lever bottom surface at a position spaced apart from the pivot, the shaft defining a shaft plane parallel to the pivot plane,
placing the drive on the top surface of the tray base;
sliding the tray base into the receiving space of the computer chassis, sliding of the tray base into the receiving space causing the shaft to be received by a receiving slot of the receiving space;
rotating the installation lever from the open position to the closed position, rotation of the installation lever from the open position to the closed position causing a distance between the pivot plane and the shaft plane to increase, the receiving slot constraining the shaft such that rotation of the installation lever from the open position to the closed position causes the connector of the drive to mate with a corresponding connector of the computing device.

12. The method of claim 11, wherein rotation of the installation lever to the closed position causes a locking surface of the installation lever to engage a corresponding locking surface of a release lever, the release lever rotatably coupled to the bottom surface of the tray base at a second pivot and rotatable between a locking position and an unlocking position; the drive tray assembly including a biasing device coupled to the release lever to bias the release lever towards the locking position, the release lever constraining the installation lever from rotation out of the closed position while the release lever is in the locking position, the release lever permitting rotation of the installation lever out of the closed position when the release lever is moved to the unlocking position.

13. The method of claim 12, further comprising:
rotating the release lever to unlock the installation lever;
rotating the installation lever to the open position; and
sliding the tray base out of the receiving space.

14. The method of claim 11, further comprising sliding a slidable wall of the drive tray assembly to an engaged position after placing the drive on the top surface of the tray base, sliding of the slidable wall to the engaged position causing one or more side retention pegs of the slidable wall to engage one or more corresponding mounting holes of the drive.

15. The method of claim 14, further comprising, in response to sliding the slidable wall to the engaged position, causing a biasing feature of the sliding wall to be received by a detent of the tray base when the sliding wall is in the engaged position.

16. The method of claim 11, the computer chassis having a drive frame coupled thereto, the receiving space of the computer chassis being a receiving space of the drive frame, the receiving slot being formed in an alignment plate of the drive frame.

17. The method of claim 16, wherein the receiving slot extends in a line from a front of the alignment plate to a first endpoint, the receiving slot having a second endpoint offset from the line, the second endpoint being positioned between the front of the alignment plate and the first endpoint such that, when the tray base is inserted into the receiving space, rotation of the installation lever from the open position to the closed position causes the shaft to engage the second endpoint.

18. The method of claim 16, wherein the alignment plate includes an additional receiving slot for receiving one or more additional shafts extending from the bottom surface of the tray base at a position between the connector plane and the shaft plane.

19. The method of claim 18, wherein the additional receiving slot extends in the longitudinal direction from a front of the alignment plate, the additional alignment plate further having, for each of the one or more additional shafts, a respective perpendicular slot extending from the additional receiving slot towards the connector plane, rotation of the lever from the open position to the closed position causing each of the one or more additional shafts to travel along the respective perpendicular slot.

20. The method of claim 16, wherein the computer chassis includes a drive backplane coupled to the drive frame, the drive backplane supporting the corresponding connector such that rotation of the installation lever from the open position to the closed position while the tray base is received by the receiving space causes the connector of the drive to mate with the corresponding connector of the drive backplane.

* * * * *